United States Patent [19]
Gee et al.

[11] Patent Number: 5,951,786
[45] Date of Patent: Sep. 14, 1999

[54] LAMINATED PHOTOVOLTAIC MODULES USING BACK-CONTACT SOLAR CELLS

[75] Inventors: James M. Gee; Stephen E. Garrett; William P. Morgan; Walter Worobey, all of Albuquerque, N.Mex.

[73] Assignee: Sandia Corporation

[21] Appl. No.: 08/994,071

[22] Filed: Dec. 19, 1997

[51] Int. Cl.$^6$ .................................................... H01L 31/05
[52] U.S. Cl. ......................................... 136/256; 136/259
[58] Field of Search ................................... 136/256, 251, 136/259, 258

[56] References Cited

U.S. PATENT DOCUMENTS

| | | | |
|---|---|---|---|
| 5,468,652 | 11/1995 | Gee | 437/2 |
| 5,797,998 | 8/1998 | Wenham et al. | 136/255 |

OTHER PUBLICATIONS

A. Schönecker, H. H. C. De Moor, A. R. Burgers, A. W. Weeber, J. Hoomstra, W. C. Sinke, P.P. Michiels, R. A. Steeman, An Industrial Multi–Crystalline EWT Solar Cell with Screen Printed Matallisation, 14$^{th}$ European Photovoltaic Solar Energy Conference and Exhibition (ECPVSEC), Barcelona, Spain, Jun./Jul. 1997.

David Thorp,*Methods of Contacting Multijunction Silicon Photovoltaic Modules*, 14$^{th}$ ECPVSEC, Barcelona, Spain Jun./Jul. 1997.

Frank R. Jeffrey, Derrick P. Grimmer, Steven Brayman, Bradley Scandrett, Michael Thomas, Steven A. Martens, Wei Chen, and Max Noak, *PVMaT Improvements in Monolithic a–Si Modules on Continuous Polymer Substrates*, CP394, NREL/SNL Photovoltaics Program Review, AIP Press, New York, 1997, pp. 451–461.

J. I. Hanoka, P. M. Kane, R. G. Chleboski, and M. A. Farber, *Advanced Polymer PV System*, CP394, NREL/SNL Photvoltaics Program Review, AIP Press, New York, 1997, pp. 859–866.

Michael Kardauskas, Juris Kalejs, Jeff Cao, Eric tornstrom, Ronald Goniorawski, Colleen O'Brien, and Mert Prince, *Market–Driven Improvements in the Manufacturing of EFG Modules*, CP394, NREL/SNL Photovoltaics Program Review, AIP Press, New York, 1997, pp. 851–585.

G. J. Pack and J. A. Mann, New Component Development for Multi–100kW Low–Cost Solar Array Applications, IEEE, 1982.

James M. Gee, W. Kent Schuvert, and Paul A. Basore, Emitter Wrap–Through Solar Cell, 23$^{rd}$ IEEE Photovoltaic Specialists Conference, Louisville, KY, May 1993.

James M. Gee, M. E. Buck, W. Kent Schubert, and Paul A. Basore, Progress on the Emitter Wrap–Through Silicon Solar Cell, 12$^{th}$ European Community Photovoltaic Solar Energy Conference, Amsterdam, The Netherlands, Apr. 1994.

Kim W. Mitchell, Richard R. King, Theresa L. Jester, and Michael McGraw, The Reformation of Cz Si Photovoltaics, First WCPEC; Dec. 5–9, 1994; Hawaii, IEEE 1994.

S. R. Wenham, M. A. Green, M. E. Watt, *Applied Photovoltaics*, Chapter 5, Centre for Photovoltaic Devices and Systems, University of South Wales, 1995.

*Primary Examiner*—John Goodrow

[57] ABSTRACT

Photovoltaic modules which comprise back-contact solar cells, such as back-contact crystalline silicon solar cells, positioned atop electrically conductive circuit elements affixed to a planar support so that a circuit capable of generating electric power is created. The modules are encapsulated using encapsulant materials such as EVA which are commonly used in photovoltaic module manufacture. The module designs allow multiple cells to be electrically connected in a single encapsulation step rather than by sequential soldering which characterizes the currently used commercial practices.

21 Claims, 3 Drawing Sheets

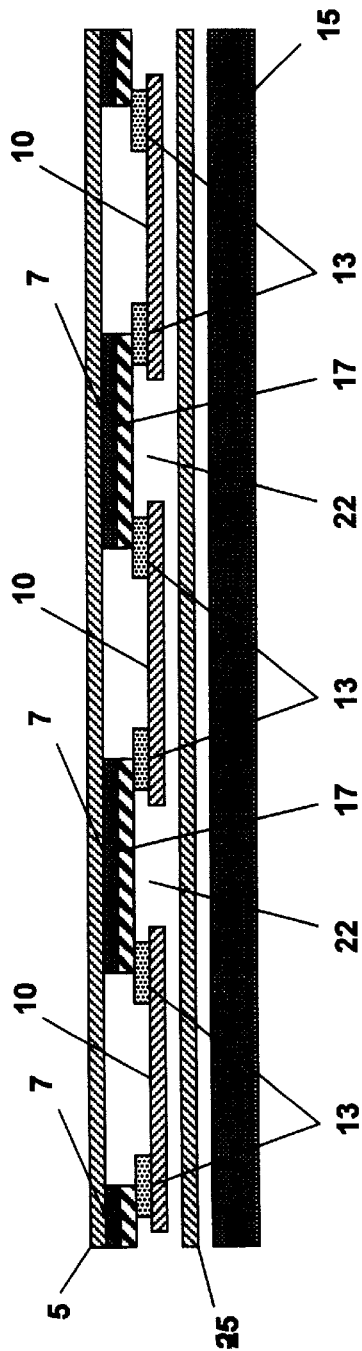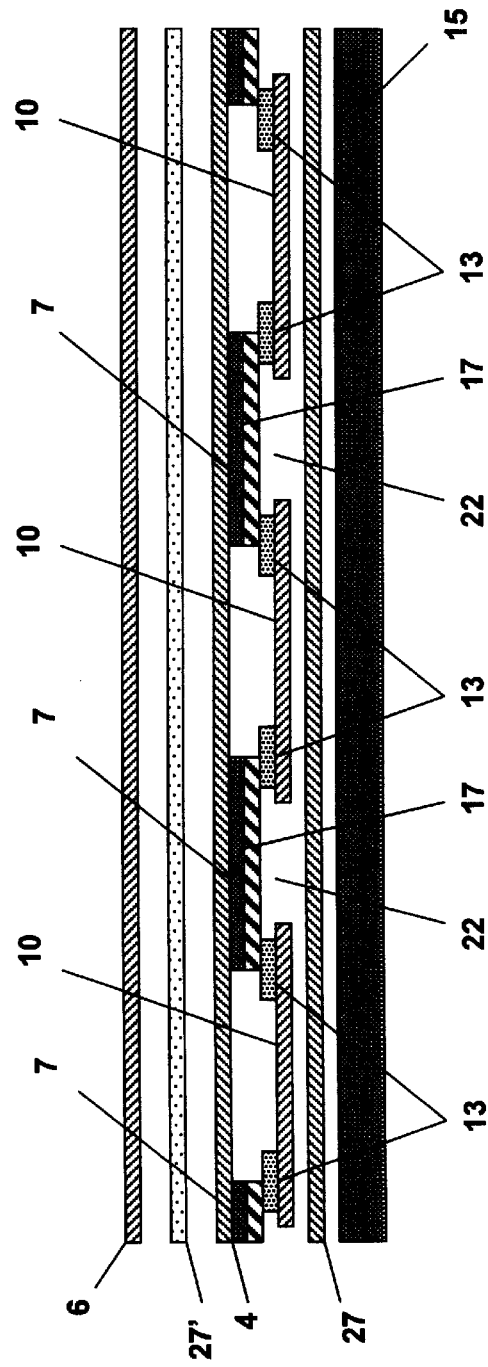

LAMINATED PHOTOVOLTAIC MODULES USING BACK-CONTACT SOLAR CELLS

GOVERNMENT RIGHTS

The United States Government has rights in this invention pursuant to Contract No. DE-AC04-94AL85000 awarded by the U.S. Department of Energy.

BACKGROUND OF THE INVENTION

Field of Invention

This invention pertains to laminated photovoltaic modules that employ the use of back-contact photovoltaic cells to minimize shading and resistance losses. In the preferred embodiment, cost savings and high-performance are achieved using back-contact crystalline silicon solar cells and materials such as EVA and Tedlar™ which are familiar to those skilled in the art of photovoltaic module assembly. The modules of the present invention exhibit improvements over the current state of the art due, in part, to a reduced number processing of steps, elimination of certain low-throughput steps, and easy automation capability associated with their manufacture.

DESCRIPTION OF THE RELATED ART

Photovoltaic (PV) modules are large-area optoelectronic devices that convert solar radiation directly into electrical energy. They require good electrical and optical performance and, because of the low energy density of solar radiation, exceptionally low manufacturing and material costs to be competitive with other electrical-energy generating options. Most PV modules presently use discrete crystalline-silicon (c-Si) solar cells that are connected in an electrical circuit and encapsulated with a glass cover and polymer backsheet for environmental protection. While very successful, the basic design and assembly process of present c-Si PV modules are over 20 years old and they exhibit certain drawbacks. The most commonly used module design inherently results in obscuration of a portion of the collecting surfaces of the solar cells, and the assembly process includes difficult steps requiring delicate and costly manipulation of components.

Existing uses and construction methods for photovoltaic cells and modules are described extensively in the literature. Useful references include the following: A. Schoenecker, et al., "An Industrial Multi-Crystalline EWT Solar Cell with Screen Printed Metallisation", 14th European Photovoltaic Solar Energy Conference and Exhibition (ECPVSEC), Barcelona, Spain, June/July 1997; D. Thorp, "Methods of Contacting Multijunction Silicon Photovoltaic Modules", 14th ECPVSEC, Barcelona, Spain, June/July 1997; F. Jeffrey, et al., "PVMaT Improvements in Monolithic a-Si Modules of Continuous Polymer Substrates", CP394, NREL/SNL Photovoltaics Program Review, AIP Press, New York, 1997, pp. 451–461; J. Hanoka, et al., "Advanced Polymer PV System", CP394, NREL/SNL Photovoltaics Program Review, AIP Press, New York, 1997, pp. 859–866; M. Kardauskas, et al., "Market-Driven Improvements in the Manufacturing of EFG Modules", CP394, NREL/SNL Photovoltaics Program Review, AIP Press, New York, 1997, pp. 851–858; G. Pack, et al., "New Component Development for Multi-100 kW Low-Cost Solar Array Applications", IEEE, 1982; K Mitchell, et al., "The Reformation of Cz Si Photovoltaics", First WCPEC, IEEE, 1994; J. Gee, et al., "Emitter Wrap-Through Solar Cell", 23rd IEEE Photovoltaic Specialists Conference, Louisville, Ky., May 1993; J. Gee, et al., "Progress on the Emitter Wrap Through Silicon Solar Cell", 12th European Community Photovoltatic Solar Energy Conference, Amsterdam, The Netherlands, April 1994.

In a typical c-Si PV module manufactured using the current commercial technology, solar cells bearing electrical contacts on both the front and back surfaces are arranged in a grid and electrically connected either in series or in parallel. Most PV cells employed in commercial technology have electrical contacts on both the front and back surfaces on the cells to collect charges flowing through the semiconductor substrates of the cells. In order to electrically connect the cells and create a power generating array, the front surface contacts of one cell are connected to the back surface contacts of another adjacent cell by means of electrical conductors (or tabs). Because of the electrical contact configuration of the cells and the necessity to string the cells electrically in a front-to-back fashion, the tabs on one cell necessarily overlay a portion of the collecting surface of that cell before connecting to the back contacts of an adjacent cell. Stringing of cells in this fashion has two important negative consequences for light-to-electrical energy conversion efficiency: 1) collection efficiency of the cells is not optimized due to a portion of their collecting surfaces being obscured by tabs, and 2) the packing density of solar cells within a module is diminished because of the space needed to accommodate the electrical connections going from the front of one cell to the back of an adjacent cell.

In the commercial process commonly used for module assembly using cells with both front and back contacts, several steps are required. Tabs are soldered on the front contacts of the cells individually, and then the cells are electrically connected by sequentially soldering them into the circuit. Next, being careful not to strain the electrical connections, cumbersome suction cup technology is employed to grasp the fragile electrical circuit and transfer it to an encapsulation work station. Finally, the cell circuit is encapsulated in the module. (See S. R. Wenham, M. A. Green, and M. W. Waft, *Applied Photovoltaics,* Chapter 5, Centre for Photovoltaic Devices and Systems, University of New South Wales, 1995.) This process typically requires at least three work stations with low throughput and relatively expensive automation. This 20-year-old module design and assembly process were adequate when the cost of silicon substrates completely dominated the cost of the finished PV module. However, recent advances in c-Si growth and wafering have reduced the cost of the wafer, and now the single largest cost element in a c-Si PV module is assembly and materials. (K. W. Mitchell, et al, 1st World Conference on Photovoltaic Energy Conversion, 1266–1269, 1994.)

These shortcomings associated with existing commercial PV module construction are overcome through the use of back contact c-Si solar cells and the module configurations disclosed here. Briefly, the back-contact c-Si solar cells contemplated for use in the best mode for practicing the claimed invention are solar cells with coplanar contacts on the back surface which employ laser-drilled vias connecting the front-surface carrier-collector junction to an electrode grid on the back surface (see U.S. Pat. No. 5,468,652, James M. Gee). Use of these or other back-contact cells obviates the necessity for tabs to overlay the collecting surfaces of the cells, and enables manufacturers to arrange cells more closely together within the cell grid. Moreover, using back-contact cells can avoid the difficult automation and high stress points associated with front-to-back-lead attachment, and allow for planar processes that permit all of the cells in a PV module to be electrically connected in a single step.

BRIEF SUMMARY OF THE INVENTION

The present invention uses a module backplane that has both the electrical circuit and planar support or backsheet in a single piece. The back-contact solar cells connected to the electrical circuit are secured and mechanically stabilized by encapsulant which serves also to stabilize the other module components.

Accordingly, it is an object of the invention to provide a laminated photovoltaic module which comprises: a planar member having two sides, an array of electrical conductors affixed to one side of the planar member and comprising a plurality of individual electrical conductors, a plurality of back-contact solar cells bearing electrical terminals overlaying the array of electrical conductors with the electrical terminals in electrical contact with the electrical conductors and assembled in the fashion that an electrical circuit capable of generating power is created. Encapsulation material supports the components and is in physical contact with the back-contact solar cells.

It is another object of the invention to provide a laminated photovoltaic module comprising: a planar structural support which comprises a mesh and having two sides, an array of electrical conductors affixed to one side of the planar structural support. The array comprises a plurality of individual electrical conductors, and a plurality of back-contact crystalline silicon solar cells bearing electrical terminals overlays the array of electrical conductors with the electrical terminals in electrical contact with the electrical conductors in the fashion that an electrical circuit capable of generating power is created. A sheet of glass overlays the back-contact crystalline silicon solar cells, a layer of protective material covers the planar structural support on the side opposite the side to which the electrical conductors are affixed, and encapsulation material is in physical contact with the back-contact crystalline silicon solar cells between the layer of protective material and the sheet of glass.

Upon further study of the specification and appended claims, further objects and advantages of the invention will become apparent to those skilled in the art.

BRIEF DESCRIPTION OF THE DRAWINGS

FIG. 3 illustrates the arrangement of PV module components in one embodiment of the invention.

FIG. 4 illustrates the arrangement of PV module components in another embodiment of the invention.

DETAILED DISCUSSION

New module concepts are disclosed here which use back-contact c-Si solar cells such as the ones described in the Gee, U.S. Pat. No. 5,468,652, mentioned above. The principles of the invention, however, would apply equally as well to any solar cells bearing electrical contacts on a single side rather than on two sides. As stated in previous sections, current commercial PV modules are typically manufactured using solar cells with contacts both on the front and back surfaces of the photovoltaic substrate. Significant cost savings and improvements in module assembly throughput can be achieved with module concepts that encapsulate and electrically connect all the cells in the module in a single step. The new modules claimed here incorporate the following features: (1) back-contact cells, (2) a module backplane that has both the electrical circuit and the encapsulation/backsheet in a single piece, and (3) a single-step process for assembly of these components into a module. These features result in cost savings because of the reduced number of steps needed in manufacturing, elimination of low-throughput steps such as individual cell tabbing and cell stringing, and easy automation due to utilization of completely planar processes. These planar processes are referred to here collectively as "monolithic module assembly", and the modules manufactured according to these processes are referred to as "monolithic modules", since they translate many of the advantages of monolithic module construction of thin-film PV to wafered c-Si PV. Simplifications in module fabrication may reduce cost of module fabrication by up to 50% which corresponds to a reduction of around 25% in the total manufacturing cost for a module. (For cost reduction estimates for a space PV array using back-contact solar cells, see G. J. Pack and J. A. Mann, $16^{th}$ IEEE Photovoltaic Specialists Conference, 36–38, 1982.)

For the descriptions that follow, relational terms such as "above", "atop", "on", "below", "over" and "under" (and other similar expressions) are used only for convenience in describing the invention as depicted in the figures. They are not intended to require a particular orientation to accomplish the ends of the invention or to limit scope of the appended claims.

Figure 1:
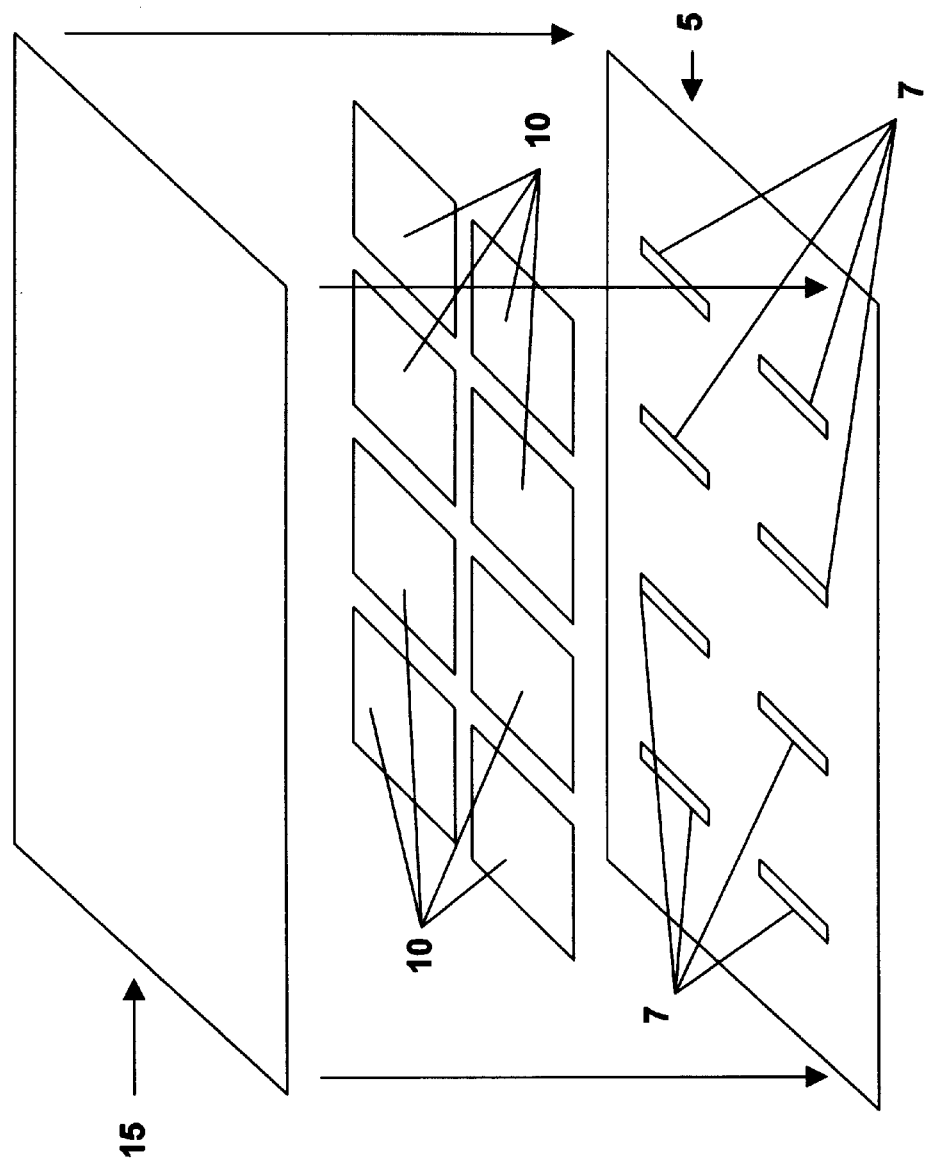
FIG. 1 contains and illustration of how certain of the modules of the present invention are assembled and shows the principle or placing the back-contact PV cells over an array of electrical conductors.

FIG. 1 shows schematically how the various elements within the invention "monolithic module" are assembled. Referring to FIG. 1, electrically conductive circuit elements 7 are prepatterned (or placed) onto the surface of a backsheet 5. The pattern is selected based on the electrical requirements of the module to be manufactured and in part dictated by the dimensions of the solar cells to be used on the module. Specifically, the electrical circuit elements (or conductors) are positioned so that when they connected by solar cells, an electric circuit capable of generating power is created. The decisions about how precisely to configure the electrical circuit and where exactly to locate the electrically conductive circuit elements 7 relative to each other are within the capabilities of skilled practitioners in the art of PV module constriction.

Back-contact solar cells 10 are then positioned atop the electrically conductive circuit elements 7 so that the contacts of the solar cells complete the circuit. The advantage of prepositioning the electrical conductors and then placing solar cells in contact with the conductors is that this enables all of the electrical conductors to be arranged on a module or section of a module in one step and all of the solar cells likewise to be positioned in one step. This represents significant potential cost savings over sequentially soldering solar cells and connector tabs in series or in parallel to create a desired electrical circuit.

A sheet of polymer encapsulation material (not shown in the figure) is then positioned over the surfaces of the solar cells 10 and the backsheet 5, and finally a cover 15 of glass is placed atop the assembled elements. (It is anticipated that materials other than glass may serve the objectives and purposes of those manufacturing given modules. Although glass is used in the best mode, such other materials are contemplated by this invention and are intended to fall within the scope of the claims.) The module is then sealed using heat and pressure or another sealing method suited to the particular polymer encapsulation material selected. In the best mode demonstrated by the inventors, vacuum pressure laminators common in the field of PV module construction are used, however, other lamination technologies such as rollbased laminators can be adapted to manufacture the modules of the claimed invention.

One of the issues to be considered in is selection of suitable materials for establishing good (and durable) electrical connections between the back-contact solar cells and the conductive circuit elements while not significantly detracting from the economy associated with manufacturing monolithic photovoltaic modules. In addition, such materials must be able to adequately withstand the encapsulation and lamination processes associated with monolithic module assembly. In developing the invention, the following interconnect technologies were considered: solder, resistance welding, silver-filled conductive epoxies, and copper foils coated with either pressure-sensitive or thermosetting conductive adhesive. In addition to adhesives containing silver, adhesives with other conductive particles serve the objects of the invention, including adhesives containing carbon and those containing gold or other electrically conductive metals.

Figure 2:
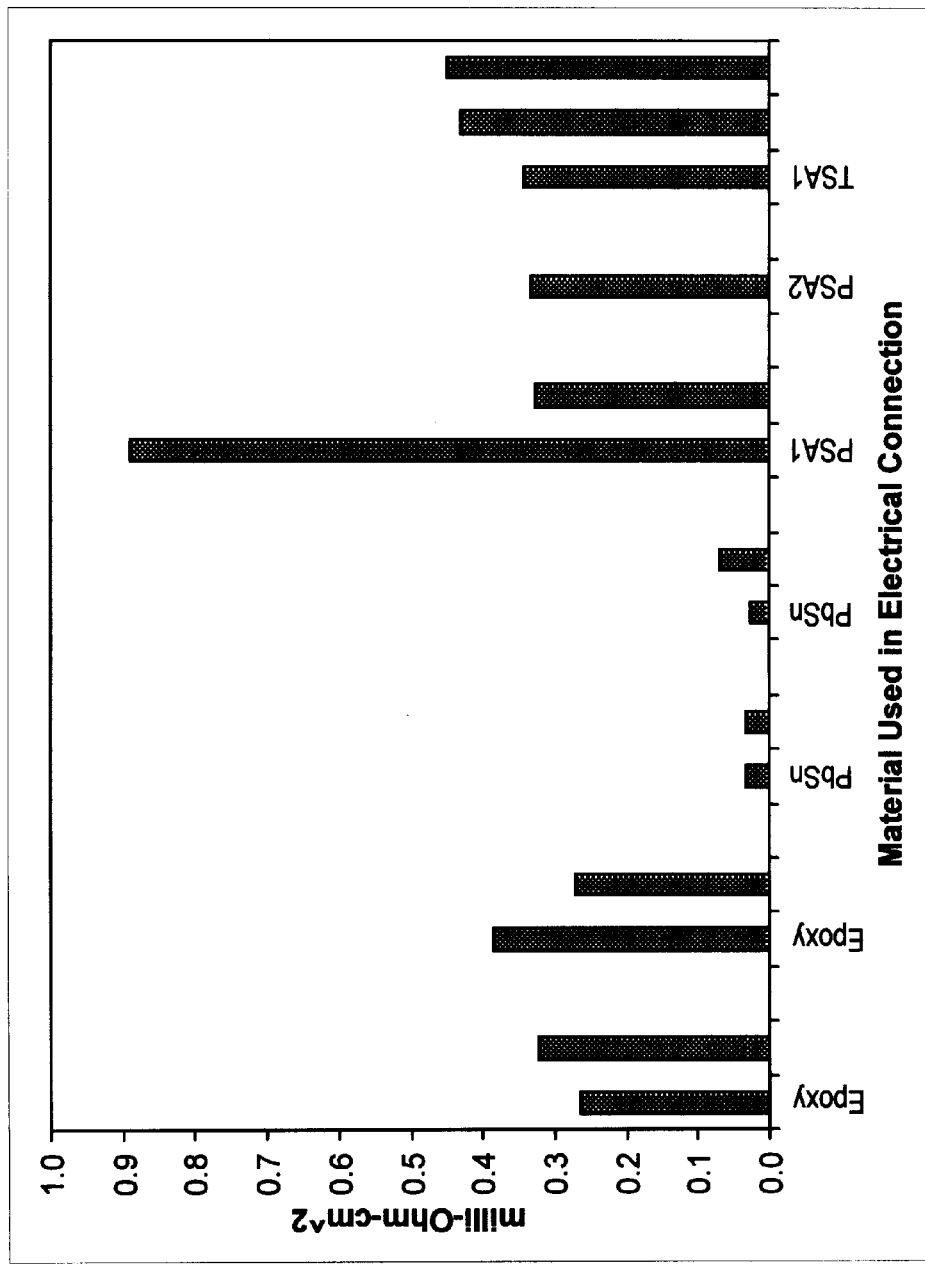
FIG. 2 shows resistance data for various materials tested for use in the modules of the claimed invention.

FIG. 2 shows on a graph data on the resistance of the different interconnect technologies examined and evaluated for use in this invention. Comparisons were made of resistance between copper tabs and a solar-cell silver for silver-loaded epoxy, Pb:Sn solder, two types of pressure-sensitive conductive adhesives (PSA) and thermosetting conductive adhesive (TSA). Several samples of each type were measured. All the interconnects met the target resistance of less than 1 m$\Omega$cm$^2$. None of the materials could achieve a resistance as low as Pb:Sn solder, and soldering represents a viable option for electrically connecting the cells to the traces in the monolithic module as it achieves good wetting of surfaces during encapsulation. Because of the need to ensure compatibility of materials, though, other options are considered as well.

The conductive adhesives were satisfactory from the standpoint of cost and are believed to be more compatible with the encapsulation materials and process than the other interconnect options. The pressure-sensitive adhesives tested by the inventors showed some promise, yet reproducibility and reliability of results were not as favorable as some of the other technologies. Based on these considerations, copper foil coated with a thermosetting conductive adhesive containing silver particles is considered to be the best interconnect alternative. Other conductive adhesives or epoxies, though, with or without metal particles, may be used and are considered to fall within the scope of the claims. Additionally, favorable results can be obtained when the conductive circuit elements are coated with tin.

Two different module configurations are shown in FIGS. 3 and 4. Referring to FIG. 3, electrically conductive circuit elements 7 are positioned on a backsheet 5. The backsheet 5 should be made of material which is capable both of providing positional accuracy of the circuit elements and protecting the completed module to it from deleterious environmental elements to which the module is likely to be exposed. As described above, the circuit elements are, for example, strips of electrically conductive foil arranged so that when back-contact solar cells 10 are placed on them the circuit is completed. As shown in the figure, in order for the circuit to be completed, the solar cells are positioned so that the terminals 13 on the cells (corresponding to the p-type and n-type current collection grids of the cells) are in electrical contact with the electrically conductive circuit elements 7. The figure also shows the circuit elements to be coated with a conductive adhesive 17 which serves both to enhance the electrical conduction between the electrically conductive circuit elements 7 and the cell terminals 13 and to provide some degree of physical stabilization to these components during the remainder of the assembly process. Various conductive adhesives be used for this purpose, as indicated in the discussion above pertaining to FIG. 2.

Following placement of the solar cells 10, a sheet of encapsulant material 25 capable of flowing upon application of heat and pressure is positioned over the cells, and finally, a sheet of transparent protective material 15 (such as glass) is positioned over the sheet of encapsulant material 25. The sequence of placement of the elements described can be altered or reversed without departing from the spirit of the invention. For example, the glass can be positioned first, followed by the encapsulant, cells and backsheet (with electrically conductive circuit elements attached).

After the various components have been positioned as described, the assembly is laminated using application of heat and pressure by any of a variety of photovoltaic module lamination processes known to those skilled in the art of photovoltaic module manufacture. Examples include use of a vacuum pressure laminator or roll-based laminator.

It is important to note here that when the electrically conductive circuit elements 7 are initially arranged on the backsheet 5, they need to be positioned so that, after the solar cells 10 are placed on them, gaps 22 are left between the surfaces of the solar cells. These gaps accommodate thermal expansion of the cells both during the lamination procedure and in a completed module exposed to sunlight. They also allow encapsulant material to flow between the cells and into the interstices surrounding the module components during the lamination process, thereby allowing the encapsulant to provide physical support to the components in the finished module.

The result is a photovoltaic module which, in the simplest case needed in order to be functional, includes a planar member having two sides, an array of electrical conductors affixed to one side of the planar member, a plurality of back-contact solar cells bearing electrical terminals overlaying the array of electrical conductors with the electrical terminals in electrical contact with the electrical conductors thereby creating an electrical circuit capable of generating power, and encapsulation material in physical contact with the back-contact solar cells. A sheet of glass or, in theory, other durable transparent material is included to shield the electrical components of the module from environmental hazards.

Referring to FIG. 4, a slightly more complex module is illustrated. In this configuration, a planar piece of mesh 4 (made, for example, of a polymer material) is used as the surface on which electrically conductive circuit elements 7 are positioned. In this embodiment, considerations regarding the placement of the conductive circuit elements are similar to those mentioned above in the discussion of FIG. 3. Again, solar cells are positioned so that the terminals 13 on the cells are in electrical contact with the electrically conductive circuit elements 7. Also, as in the previously described embodiment, the figure shows the circuit elements coated with a conductive adhesive 17.

In this embodiment, two sheets of encapsulant material are used, one sheet 27 adjacent to the cells 10, and the other sheet 27' on the side of the planar piece of mesh 4 opposite the side to which the electrically conductive circuit elements 7 were affixed. In the best mode, the preferred encapsulant material is ethylene vinyl acetate (EVA) which is a commonly used encapsulant material in the photovoltaic industry.

FIG. 4 also illustrates use of a protective backsheet 6 positioned beyond the encapsulant material on the side of the planar mesh 4 away from the electrically conductive circuit elements 7 and solar cells 10. The purpose of this backsheet 6 is to provide protection against the environmental elements. A typical backsheet material such as Tedlar™, commonly used in the commercial photovoltaic industry, is suitable for this purpose. Protection for the front side of the solar cells, as in the previous embodiment, is provided by placing a sheet of glass or other appropriate transparent protective material 15 over the sheet of encapsulant material adjacent to the surfaces of the cells 10.

As described for the previous embodiment, after the various components in this embodiment have been positioned as described, the assembly is laminated using application of heat and pressure by photovoltaic module lamination processes known in the industry. The reason for using a planar piece of mesh 4 in this embodiment to support the circuit is to allow the encapsulant material to flow through openings in the mesh, as well as around the cells 10 and electrically conductive circuit elements 7 to allow a full encapsulation which helps to seal the protective backsheet 6 to the back side of the module an the sheet of transparent protective material 15 to the front side of the module. Again, in order to accomplish optimal encapsulation of the PV module elements, the cells 10 need to be positioned such that gaps 22 are left between them though which encapsulant can flow upon application of heat and pressure.

The result in this embodiment is a photovoltaic module which, in the simplest case needed in order to be functional, includes a planar structural support comprising a mesh and having two sides, an array of electrical conductors affixed to one side of the planar structural support, back-contact crystalline silicon solar cells bearing electrical terminals overlaying the array of electrical conductors with the electrical terminals in electrical contact with the electrical conductors and creating an electrical circuit capable of generating power is created, a sheet of glass overlaying the back-contact crystalline silicon solar cells, a protective backsheet covering the planar structural support on the side opposite the side to which the array of electrical conductors is affixed, and encapsulation material in physical contact with the back-contact crystalline silicon solar cells and between the protective backsheet and the sheet of glass.

Having thus described the invention, changes and modifications in the specifically described embodiments can be carried out without departing from the scope of the invention which is intended to be limited only by the scope of the appended claims.

What is claimed is:

1. A laminated photovoltaic module comprising a planar structural support comprising a mesh and having two sides, an array of electrical conductors affixed to one side of said planar structural support, said array comprising a plurality of individual electrical conductors, a plurality of back-contact crystalline silicon solar cells bearing electrical terminals overlaying said array of electrical conductors with said electrical terminals in electrical contact with said electrical conductors whereby an electrical circuit capable of generating power is created, a sheet of glass overlaying said plurality of back-contact crystalline silicon solar cells, a layer of protective material covering said planar structural support on the side opposite the side to which said array of electrical conductors is affixed, and encapsulation material between said layer of protective material and said sheet of glass, and being in physical contact with said back-contact crystalline silicon solar cells.

2. The laminated photovoltaic module of claim 1 further comprising a conductive adhesive between said electrical terminals of said back-contact crystalline silicon solar cells and said electrical conductors.

3. The laminated photovoltaic module of claim 2 wherein said conductive adhesive comprised solder.

4. The laminated photovoltaic module of claim 3 wherein said solder comprises lead and tin.

5. The laminated photovoltaic module of claim 4 wherein said electrical conductors comprise copper.

6. The laminated photovoltaic module of claim 5 wherein said copper is coated with tin.

7. The laminated photovoltaic module of claim 2 wherein said conductive adhesive comprises thermosetting adhesive.

8. The laminated photovoltaic module of claim 7 wherein said thermosetting adhesive comprises electrically conductive metal particles.

9. The laminated photovoltaic module of claim 8 wherein said electrically conductive metal particles comprise silver.

10. The laminated photovoltaic module of claim 2 wherein said conductive adhesive comprises pressure sensitive adhesive.

11. The laminated photovoltaic module of claim 10 wherein said pressure sensitive adhesive comprises electrically conductive metal particles.

12. The laminated photovoltaic module of claim 11 wherein said electrically conductive metal particles comprise silver.

13. The laminated photovoltaic module of claim 2 wherein said conductive adhesive comprises epoxy.

14. The laminated photovoltaic module of claim 13 wherein said epoxy comprises electrically conductive metal particles.

15. The laminated photovoltaic module of claim 14 wherein said electrically conductive metal particles comprise silver.

16. The laminated photovoltaic module of claim 7 wherein said thermosetting adhesive comprises carbon particles.

17. The laminated photovoltaic module of claim 8 wherein said electrically conductive metal particles comprise gold.

18. The laminated photovoltaic module of claim 10 wherein said pressure sensitive adhesive comprises carbon particles.

19. The laminated photovoltaic module of claim 11 wherein said electrically conductive metal particles comprise gold.

20. The laminated photovoltaic module of claim 13 wherein said epoxy comprises carbon particles.

21. The laminated photovoltaic module of claim 14 wherein said electrically conductive metal particles comprise gold.

* * * * *